(12) United States Patent
Chiang et al.

(10) Patent No.: US 6,313,033 B1
(45) Date of Patent: Nov. 6, 2001

(54) IONIZED METAL PLASMA TA, TAN$_X$, W, AND WN$_X$ LINERS FOR GATE ELECTRODE APPLICATIONS

(75) Inventors: Tony Chiang, San Jose; Bingxi Sun; Suraj Rengarajan, both of Sunnyvale; Peijun Ding, San Jose; Barry Chin, Saratoga, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/362,923

(22) Filed: Jul. 27, 1999

(51) Int. Cl.$^7$ ..................................................... H01L 21/44
(52) U.S. Cl. ............................................ 438/654; 438/656
(58) Field of Search ................................... 438/654, 656, 438/652, 680, 674

(56) References Cited

U.S. PATENT DOCUMENTS

| | | |
|---|---|---|
| 4,364,099 | 12/1982 | Koyama et al. . |
| 4,649,625 | 3/1987 | Lu . |
| 4,753,851 * | 6/1988 | Roberts et al. . |
| 4,760,369 | 7/1988 | Tiku . |
| 5,142,438 | 8/1992 | Reinberg et al. . |
| 5,225,363 | 7/1993 | Riemenschneider et al. . |
| 5,352,623 | 10/1994 | Kamiyama . |
| 5,487,923 * | 1/1996 | Min et al. . |
| 5,508,221 | 4/1996 | Kamiyama . |
| 5,563,090 | 10/1996 | Lee et al. . |
| 5,614,437 | 3/1997 | Choudhury . |
| 5,633,200 | 5/1997 | Hu . |
| 5,654,233 * | 8/1997 | Yu . |
| 5,717,628 | 2/1998 | Hammerl et al. . |
| 6,140,228 * | 10/2000 | Shan et al. . |

* cited by examiner

Primary Examiner—Sheila V. Clark
(74) Attorney, Agent, or Firm—Moser, Patterson & Sheridan, L.L.P.

(57) ABSTRACT

The invention provides a method for forming a microelectronic device comprising: forming a first electrode; depositing an adhesion layer over the first electrode utilizing high density plasma physical vapor deposition, wherein the adhesion layer comprises a material selected from Ta, TaN$_x$, W, WN$_x$, Ta/TaN$_x$, W/WN$_x$, and combinations thereof, depositing a dielectric layer over the adhesion layer; and forming a second electrode over the dielectric layer. The invention also provides a microelectronic device comprising: a first electrode; a second electrode; a dielectric layer disposed between the first and second electrodes; and an adhesion layer disposed between the first electrode and the dielectric layer, wherein the adhesion layer comprises a material selected from Ta, TaN$_x$, W, WN$_x$, Ta/TaN$_x$, W/WN$_x$, and combinations thereof.

11 Claims, 2 Drawing Sheets

IONIZED METAL PLASMA TA, TAN$_x$, W, AND WN$_x$ LINERS FOR GATE ELECTRODE APPLICATIONS

BACKGROUND OF THE INVENTION

1. Field of the Invention

The present invention generally relates to integrated circuits and fabrication of semiconductor devices. More particularly, the present invention relates to gate electrode materials in semiconductor devices.

2. Background of the Related Art

Dynamic random-access memory (DRAM) integrated circuits are commonly used for storing data in a digital computer. Currently available DRAMs may contain over 16 million cells fabricated on a single crystal silicon chip, wherein each memory cell generally comprises a single transistor connected to a miniature capacitor. In operation, each capacitor may be individually charged or discharged in order to store one bit of information. A DRAM is dynamic in the sense that charged memory cells must be refreshed or recharged periodically to maintain data integrity. Otherwise, charged memory cells may discharge through leakage to a level where they no longer appear to be set to a charged state.

A typical DRAM device generally comprises a capacitor and an access transistor. The access transistor is typically disposed above a trench capacitor to minimize the chip space occupied by the DRAM device. A trench capacitor is typically defined by a trench structure etched in the substrate. The substrate, typically doped P+ type, serves as the first electrode of the trench capacitor and is typically connected to a ground connection. The interior surfaces of the trench structure are covered by a composite dielectric film, such as a composite film of $SiO_2/Si_3N_4/SiO_2$, which serves as the dielectric for the capacitor. The trench structure is typically filled with a heavily doped N+ polysilicon that serves as the second electrode of the capacitor. The access transistor is typically connected to the second electrode of the trench capacitor.

To facilitate construction of increasingly higher density DRAMs with correspondingly smaller-sized memory cells, capacitor structures and materials that can store the charge in smaller chip space are needed. High dielectric constant (HDC) materials (defined herein as having a dielectric constant greater than about 50) have been used successfully in such capacitor structures in many microelectronic applications, such as DRAMs. One such HDC material, $Ta_2O_5$, has become a promising choice for the next generation of high density memory cells. Currently, the $Ta_2O_5$ dielectric layer is deposited and then annealed to generate the desired dielectric constant. An adhesion/encapsulation layer is deposited between an electrode surface and the $Ta_2O_5$ dielectric layer to provide better adhesion between the electrode surface and the $Ta_2O_2$ dielectric layer during the anneal process. The adhesion/encapsulation layer also protects the $Ta_2O_5$ dielectric layer against diffusion between the electrode surface and the $Ta_2O_5$ dielectric layer that may cause degradation of the material properties of the device.

Titanium nitride (TiN) is currently used as the adhesion/encapsulation material for the $Ta_2O_5$ dielectric layer. However, the use of TiN as the adhesion/encapsulation material for the $Ta_2O_5$ dielectric layer has not completely satisfied the demands of the next generation of semiconductor devices. Silicon nitride (SiN) has also been used as a barrier, adhesion or encapsulation layer. However, the SiN barrier/adhesion/encapsulation material has similar drawbacks as the TiN material.

One particular problem is that the TiN adhesion/encapsulation material does not provide sufficient thermal performance for the anneal process required to generate higher dielectric constants (i.e., k>10) from the $Ta_2O_5$ dielectric layer. For example, the TiN adhesion/encapsulation material typically fails to protect the $Ta_2O_5$ dielectric layer at temperatures greater than about 600° C. for at least 30 seconds, which is typically required in a rapid thermal anneal process to generate higher dielectric constants from the $Ta_2O_5$ dielectric layer. Other thermal anneal processes may even require longer processing time. Typically, at the high anneal processing temperatures, the $Ta_2O_5$ dielectric film crystallizes and results in an increase in leakage current through the crystallized film. The increases in leakage current in the devices render the devices unstable and unacceptable for use, resulting in losses as defective devices.

Also, the TiN adhesion/encapsulation material is difficult to deposit into the small features having high aspect ratio (>5:1). Typically, the TiN adhesion/encapsulation layer is deposited using reactive sputtering techniques and can achieve adequate conformal coverage for features having openings greater than about 0.3 μm and aspect ratios less than about 5:1. With higher integration, the feature aperture has decreased to less than 0.25 micron while the aspect ratio of the feature may be greater than 5:1, and even greater than 10:1. It has been difficult to form thin, conformal TIN layers on the surfaces of these features. Gaps may form in the TiN adhesion/encapsulation layer, and the TiN adhesion/encapsulation layer may have uneven thickness, resulting in some regions having insufficient thickness to adequately block diffusion between adjacent layers. On the other hand, the effective dielectric property of the $Ta_2O_5$ dielectric layer in combination with the TiN adhesion/encapsulation layer may be too low if the TiN adhesion/encapsulation layer is too thick. Thus, the difficulty in depositing thin, conformal TiN adhesion/encapsulation layers in the sub-micron high aspect ratio features has resulted in a demand for a better adhesion/encapsulation material.

Therefore, there is a need for a method for forming microelectronic devices having high dielectric constant materials. There is also a need for an adhesion/encapsulation material useful as a gate electrode liner for the next generation of sub-micron high aspect ratio microelectronic devices. Particularly, there is a need for an adhesion/encapsulation material that is useful for forming devices in sub-micron, high aspect ratio features and can withstand high temperatures during processing, particularly during annealing treatments of the devices.

SUMMARY OF THE INVENTION

The invention generally provides microelectronic devices having high dielectric constant materials and a method for forming such devices. More particularly, the invention provides an adhesion/encapsulation material useful as a gate electrode liner for microelectronic devices. The adhesion/encapsulation material is useful for forming devices in high aspect ratio features and can withstand high temperatures during processing, particularly during anneal treatments of the devices.

One aspect of the invention provides a method for forming a microelectronic device comprising: forming a first electrode; depositing an adhesion layer over the first electrode utilizing high density plasma physical vapor deposition, wherein the adhesion layer comprises a material selected from Ta, TaN$_x$, W, WN$_x$, Ta/TaN$_x$, W/WN$_x$, or combinations thereof; depositing a dielectric layer over the adhesion layer; and forming a second electrode over the dielectric layer. Preferably, the method further comprises depositing an encapsulation layer between the dielectric layer and the second electrode utilizing high density plasma physical vapor deposition, wherein the encapsulation layer comprises a material selected from Ta, $TaN_x$, W, $WN_x$, $Ta/TaN_x$, $W/WN_x$, or combinations thereof. The adhesion layer and the encapsulation layer protect the dielectric layer during a subsequent anneal treatment which increases the dielectric constant of the dielectric layer.

Another aspect of the invention provides a microelectronic device comprising: a first electrode; a second electrode; a dielectric layer disposed between the first and second electrodes; and an adhesion layer disposed between the first electrode and the dielectric layer, wherein the adhesion layer comprises a material selected from Ta, $TaN_x$, W, $WN_x$, $Ta/TaN_x$, $W/WN_x$, or combinations thereof. Preferably, the microelectronic device further comprises an encapsulation layer deposited between the dielectric layer and the second electrode utilizing ionized metal plasma deposition, wherein the encapsulation layer comprises a material selected from Ta, $TaN_x$, W, $WN_x$, $Ta/TaN_x$, $W/WN_x$, or combinations thereof.

Yet another aspect of the invention provides a microelectronic device comprising: a bottom electrode, a top electrode, and a dielectric layer disposed between the bottom electrode and the top electrode, wherein the bottom electrode comprises a material selected from Ta, $TaN_x$, W, $WN_x$, $Ta/TaN_x$, $W/WN_x$, or combinations thereof, which is deposited utilizing ionized metal plasma deposition. Preferably, the material of the bottom electrode has a resistivity, $\rho$, less than about 500 $\mu\Omega$-cm, and even more preferably, less than about 250 $\mu\Omega$-cm.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention generally provides microelectronic devices having high dielectric constant materials and a method for forming such devices. More particularly, the invention provides an adhesion/encapsulation material useful as a gate electrode liner for the next generation of sub-micron high aspect ratio microelectronic devices. Although the invention is described in application for a DRAM device having a trench capacitor, the inventors contemplate application of the invention in other semiconductor devices.

Figure 1:
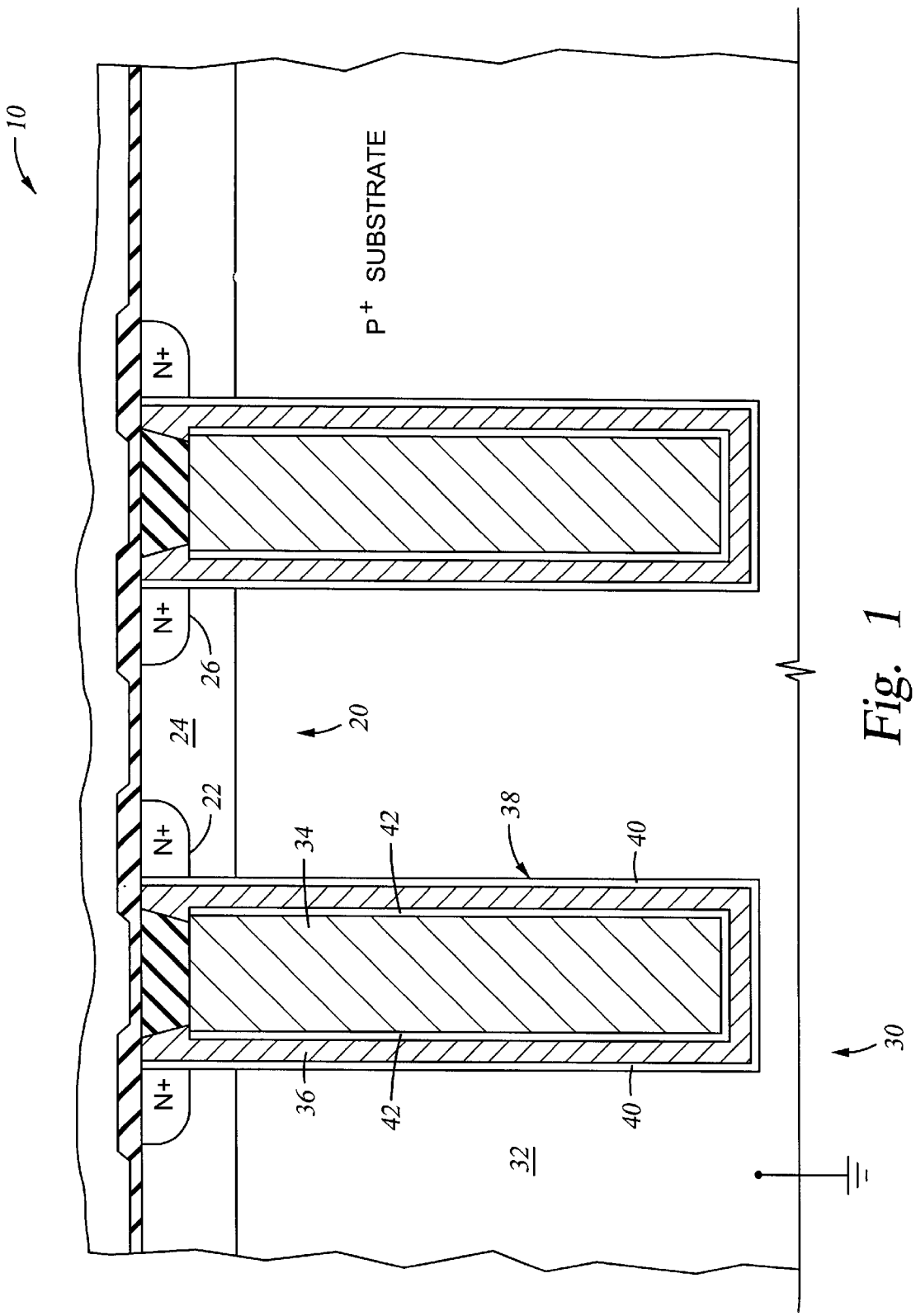
FIG. 1 is a cross sectional view of a DRAM device having a trench capacitor according to the invention.

FIG. 1 is a cross sectional view of a DRAM device having a trench capacitor according to the invention. The DRAM device 10 is formed on a silicon substrate and generally comprises an access transistor 20 and a trench capacitor 30. The inventors contemplate application of the trench capacitor according to the invention in a variety of DRAM designs in addition to the DRAM design shown for illustrative purposes in FIG. 1. For example, in one DRAM design, the access transistor is disposed at a location directly above the trench capacitor.

As shown in FIG. 1, the access transistor 20 for the DRAM device 10 is positioned adjacent a top portion of the trench capacitor 30. Preferably, the access transistor 20 comprises an n-p-n transistor having a source region 22, a gate region 24 and a drain region 26. The gate region 24 comprises a P– doped silicon epi-layer disposed over the P+ substrate. The source region 22 of the access transistor 20 comprises an N+ doped material disposed on a first side of the gate region 24, and the drain region 26 comprises an N+ doped material disposed on a second side of the gate region 24, opposite the source region 22. The source region 22 is connected to an electrode of the trench capacitor.

The trench capacitor 30 generally comprises a first electrode 32, a second electrode 34 and a dielectric material 36 disposed therebetween. The P+ substrate serves as a first electrode 32 of the trench capacitor 30 and is connected to a ground connection. A trench 38 is formed in the P+ substrate and filled with a heavily doped N+ polysilicon which serves as the second electrode 34 of the trench capacitor 30. The dielectric material 36 is disposed between the first electrode 32 (i.e., P+ substrate) and the second electrode 34 (i.e., N+ polysilicon). Although the above-described DRAM device utilizes an n-p-n transistor, a P+ substrate as a first electrode and an N+ polysilicon as a second electrode of the capacitor, other transistor designs and electrode materials are contemplated by the present invention to form DRAM devices.

According to the invention, the trench capacitor 30 includes an adhesion/encapsulation layer 40 disposed between the dielectric material 36 and the first electrode 32. Preferably, an adhesion/encapsulation layer 42 is also disposed between the dielectric material 36 and the second electrode 34. Preferably, the adhesion/encapsulation layer comprises a heavy metal such as tantalum (Ta) and tungsten (W). The film composition and properties of the adhesion/encapsulation layers are preferably tuned by including a nitrogen content to the film, resulting in $TaN_x$, and $WN_x$, films. Alternatively, the adhesion/encapsulation layer comprises a combination film, such as $Ta/TaN_x$ and $W/WN_x$. The adhesion/encapsulation layer is preferably deposited utilizing ionized metal plasma (IMP) deposition techniques, which is capable of depositing thin, conformal films on the surfaces within high aspect ratio features.

The trench capacitor 30 according to the invention is formed in a high aspect ratio trench structure. The first electrode 32 of the trench capacitor comprises a doped substrate in which the high aspect ratio trench structure is etched. Once the trench structure has been etched on the substrate, an adhesion/encapsulation layer 40 is deposited over the surfaces of the trench structure to improve the adhesion of the dielectric material 36 to the first electrode 32 (i. e., P+ substrate). According to the invention, the adhesion/encapsulation layer is preferably deposited utilizing a high density plasma physical vapor deposition techniques, such as the Ionized Metal Plasma (IMP) technique, to form thin, conformal films on the surfaces within high aspect ratio features.

Figure 2:
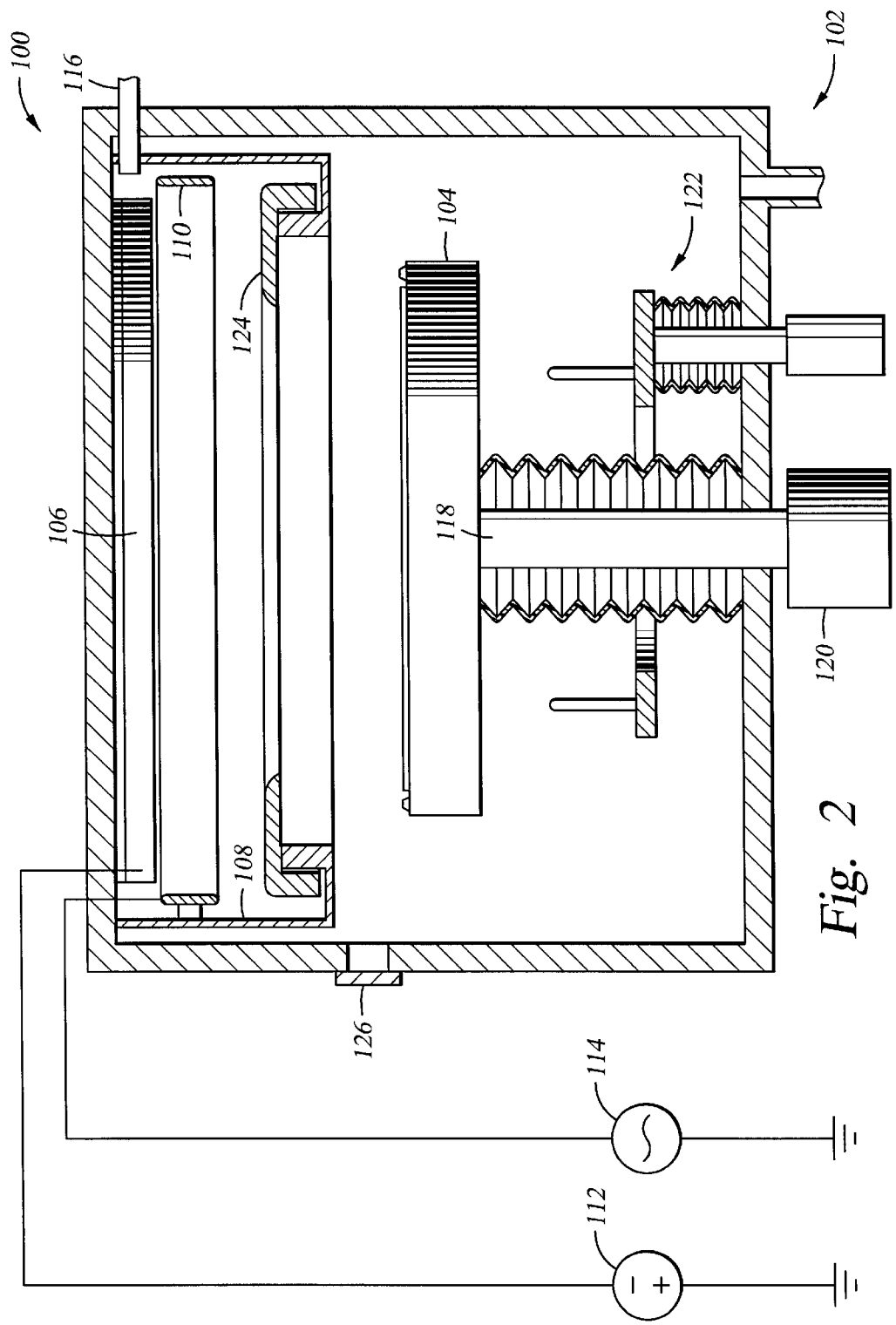
FIG. 2 is a high density plasma physical vapor deposition chamber useful for forming the gate electrode liner of the present invention.

FIG. 2 is high density plasma physical vapor deposition (HDP-PVD) chamber useful for forming the adhesion/ encapsulation layer according to the present invention. An example of a HDP-PVD chamber is the IMP® chamber available from Applied Materials, Inc., Santa Clara, Calif. The HDP-PVD deposition chamber 100 generally includes a chamber enclosure 102, a substrate support member 104, a target 106, a shield 108 and a coil 110. The target 106 is disposed opposite of the substrate support member 104 and is electrically connected to a DC power supply 112. The shield 108 generally surrounds the region between the target 106 and the substrate support member 104 and is typically connected to a ground connection. The coil 110 is disposed interior of the shield 108 and is connected to an RF power supply 114. A gas inlet 116 disposed through the enclosure 102 introduces one or more processing gases into the chamber during processing.

As shown in FIG. 2, the substrate support member 104 is attached to an actuator shaft 118 disposed through the bottom of the enclosure 102. The actuator shaft 118 is connected to an actuator 120 which facilitates movement of the substrate support member 104 to various positions in the chamber. A slit valve 126 disposed on a sidewall of the enclosure 102 facilitates transfer of substrates into and out of the chamber. A substrate lift assembly 122 disposed relative to the substrate support member 104 facilitates positioning of a substrate onto and off of the substrate support member 104. During processing, the substrate support member 104 positions a substrate disposed thereon to a position below a cover ring 124 disposed on a lower portion of the shield 108 to shield the perimeter edge of the substrate from deposition.

To achieve conformal coverage of surfaces within high aspect ratio features, the adhesion/encapsulation layer according to the invention is preferably deposited using the following processing parameters in a high density plasma physical vapor deposition (HDP-PVD) chamber. The chamber pressure during the deposition process is preferably maintained between about 5 mT and about 100 mT, even more preferably between about 10 mT and about 30 mT. The target is preferably DC-biased at between about 1 kW and about 3 kW and between about 100V and about 300 V. The coil is preferably RF-biased at between about 1 kW and about 3 kW. The substrate support member preferably provides a substrate bias at between about 0 W and about 500 W and between about 50V and about 300V.

The adhesion/encapsulation layer is preferably deposited to a thickness between about 50 Å and about 500 Å for a feature having aperture width less than about 0.25 μm and an aspect ratio greater than about 5:1. For example, an adhesion/encapsulation layer is deposited to about 300 Å for a feature having dimensions of about 0.25 μm wide and about 2.5 μm deep. The heavy metals contemplated in the present invention provide low sticking coefficients and high resputtering rates when deposited using ionized metal plasma deposition techniques which enable better conformal coverage within high aspect ratio features compared to other metals (i.e., non-heavy metals).

The adhesion/encapsulation layer according to the invention is also useful as the bottom electrode in a microelectronic device because the adhesion/encapsulation layer provides sufficient electrical conductivity. Thus, the electrode gate material and the adhesion layer for the dielectric layer are deposited with one process to improve efficiency and throughput of the system. Preferably, the bottom electrode having the material according to the invention has a resistivity, ρ, less than about 500 μΩ-cm, and even more preferably, less than about 250 μΩ-cm.

Referring back to FIG. 1, after the adhesion/encapsulation layer 40 has been deposited over the surfaces of the trench structure, the dielectric layer 36 is deposited over the adhesion layer 40. Preferably, the dielectric layer 36 comprises $Ta_2O_5$ and is deposited using reactive sputtering techniques in a HDP-PVD chamber. The dielectric layer 36 is preferably deposited to a thickness between about 20 Å and about 200 Å, even more preferably between about 80 Å and about 100 Å. An adhesion/encapsulation layer 42 is then deposited over the dielectric layer 36. Preferably, the adhesion/ encapsulation layer 42 comprises the same material as the adhesion/encapsulation layer 40 (discussed above) and is deposited using IMP deposition techniques as described for the adhesion/encapsulation layer 40. It is believed that the materials listed above provide improved adhesion of the electrode material to the dielectric material because the adhesion/encapsulation layer comprises elements from the same or similar family of elements as the dielectric material. For example, the Ta based adhesion/encapsulation layer provides better adhesion to a dielectric material comprising $Ta_2O_5$.

To complete the trench capacitor 30, the second electrode 34 is formed over the adhesion/encapsulation layer 42 in the trench structure. The material of the second electrode fills the trench structure and is connected to the source region 22 of the access transistor of the DRAM device. To complete the DRAM device, the access transistor 20 of the DRAM device is formed above or adjacent a top portion of the trench capacitor using techniques generally known in the art.

The adhesion/encapsulation layer 40 and 42 protect the dielectric layer 36 during a subsequent anneal process utilized to increases the dielectric constant of the dielectric layer. The anneal process can be performed in a variety of anneal chambers, including conventional furnace anneal chambers and rapid thermal anneal chambers. Anneal chambers in general are well known and commercially available. An example of an anneal chamber is the RTP XEplus Centura® thermal processor available from Applied Materials, Inc., Santa Clara, Calif. The inventors also contemplate using other commercially available thermal processors from manufacturers such as Eaton Corporation Thermal Processing Systems, Peabody, Mass. Preferably, the dielectric layer 36 is annealed at a temperature between about 500° C. and about 800° C. for between about 30 seconds and 120 seconds in a rapid thermal anneal process furnace. If annealed in a conventional thermal anneal furnace, the dielectric layer 36 is preferably annealed at a temperature between about 300° C. and about 600° C. for between about 5 minutes and 50 minutes.

In addition to applications as gate electrode liners, the present invention is useful in applications that benefit from an adhesion/encapsulation film having a relatively higher dielectric constant than currently practiced barrier/adhesion films. The film composition and properties of the $TaN_x$ and $WN_x$ films according to the invention provides a dielectric constant much closer to the high dielectric constant (HDC) materials such as $Ta_2O_5$, and thus, the overall effective dielectric constant of the adhesion layer, dielectric layer and encapsulation layer is not significantly lowered. Particularly, the dielectric property of $TaN_x$ and $WN_x$ films increases generally with increase in the nitrogen content in these film (i.e., where $x \geq 1$). The $TaN_x$ and $WN_x$ films according to the invention are also useful as adhesion/encapsulation layers for other HDC materials. Furthermore, the inventors also contemplate depositing Ta or W in an oxygen environment or a combination of oxygen plus nitrogen environment to form films such as $Ta_xO_y$, $Ta_xO_yN_z$, $W_xO_y$, and $W_xO_yN_z$ for applications requiring dielectric films.

While foregoing is directed to the preferred embodiment of the present invention, other and further embodiments of the invention may be devised without departing from the basis scope thereof, and the scope thereof is determined by the claims that follow.

What is claimed is:

1. A method for forming a microelectronic device, comprising:
   a) forming a first electrode;
   b) depositing an adhesion layer over the first electrode utilizing high density plasma physical vapor deposition, wherein the adhesion layer comprises a material selected from the group consisting of Ta, $TaN_x$, W, $WN_x$, $Ta/TaN_x$, $W/WN_x$, and combinations thereof;
   c) depositing a dielectric layer over the adhesion layer; and
   d) forming a second electrode over the dielectric layer.

2. The method of claim 1, further comprising:
   e) depositing an encapsulation layer between the dielectric layer and the second electrode utilizing high density plasma physical vapor deposition, wherein the encapsulation layer comprises a material selected from the group consisting of Ta, $TaN_x$, W, $WN_x$, $Ta/TaN_x$, $W/WN_x$, and combinations thereof.

3. The method of claim 1, further comprising:
   f) annealing the device in an anneal chamber.

4. The method of claim 3 wherein the device is annealed at between about 300° C. and about 600° C. for between about 5 minutes and about 50 minutes in a conventional anneal furnace.

5. The method of claim 3 wherein the device is annealed at between about 500° C. and about 800° C. for between about 30 seconds and about 120 seconds in a rapid thermal anneal processor.

6. The method of claim 1 wherein the dielectric layer comprises $Ta_2O_5$ deposited using reactive sputtering deposition techniques.

7. The method of claim 1 wherein the microelectronic device is formed within a trench-type feature on a semiconductor substrate.

8. The method of claim 1 wherein the adhesion layer is deposited in a high density plasma physical vapor deposition chamber at a chamber pressure between about 5 mT and about 100 mT.

9. The method of claim 1 wherein the high density plasma physical vapor deposition chamber includes a target biased between about 1 kW and 3 kW and between about 100V and about 300V.

10. The method of claim 1 wherein the high density plasma physical vapor deposition chamber includes a substrate support member biased between about 0 W and 500 W and between about 50V and 300V.

11. The method of claim 1 wherein the high density plasma physical vapor deposition chamber includes a coil that is RF biased between about 1 kW and about 3 kW.

* * * * *

UNITED STATES PATENT AND TRADEMARK OFFICE
CERTIFICATE OF CORRECTION

PATENT NO.    : 6,313,033 B1                                                     Page 1 of 1
DATED         : November 6, 2001
INVENTOR(S)   : Chiang et al.

It is certified that error appears in the above-identified patent and that said Letters Patent is hereby corrected as shown below:

Title page, Item [54] and Column 1, line 1,
Title, please replace "TA, TAN$_X$," with -- Ta, TaN$_X$, --.

Item [75], Inventors names, please replace "Bingxi Sun; Suraj Rengarajan, both of Sunnyvale;" with -- Bingxi Sun, Stanford; Suraj Rengarajan, Sunnyvale; --.

Column 1,
Line 54, please replace "Ta$_2$O$_2$" with -- Ta$_2$O$_5$ --.

Column 2,
Line 27, please replace "TIN" with -- TiN --.

Column 4,
Line 45, please replace "," after "WN$_X$".

Column 6,
Line 59, please replace "TaN," with -- TaN$_X$ --.
Line 59, please replace "WN," with -- WN$_X$ --.
Line 64, please replace "$_{and\ W_X}$" with -- and W$_X$ --.

Signed and Sealed this

Twenty-fourth Day of September, 2002

Attest:

Attesting Officer

JAMES E. ROGAN
*Director of the United States Patent and Trademark Office*